(12) United States Patent
Hogan

(10) Patent No.: US 6,535,418 B2
(45) Date of Patent: Mar. 18, 2003

(54) OPTICALLY PROGRAMMABLE ADDRESS LOGIC FOR SOLID STATE DIODE-BASED MEMORY

(75) Inventor: Josh N. Hogan, Los Altos, CA (US)

(73) Assignee: Hewlett-Packard Development Company, LLP, Houston, TX (US)

( * ) Notice: Subject to any disclaimer, the term of this patent is extended or adjusted under 35 U.S.C. 154(b) by 0 days.

(21) Appl. No.: 09/911,974

(22) Filed: Jul. 24, 2001

(65) Prior Publication Data

US 2003/0021147 A1 Jan. 30, 2003

(51) Int. Cl.[7] .............................................. G11C 13/00
(52) U.S. Cl. ........................ 365/175; 365/96; 365/105; 365/114; 365/115
(58) Field of Search ........................... 365/96, 105, 114, 365/115, 175

(56) References Cited

U.S. PATENT DOCUMENTS

| | | | | |
|---|---|---|---|---|
| 4,455,495 A | * | 6/1984 | Masuhara et al. | 307/44 |
| 4,597,162 A | * | 7/1986 | Johnson et al. | 29/574 |
| 4,868,616 A | | 9/1989 | Johnson et al. | |
| 5,008,729 A | * | 4/1991 | Wills et al. | 357/51 |
| 5,691,089 A | * | 11/1997 | Smayling | 257/40 |
| 5,712,588 A | * | 1/1998 | Choi et al. | 327/525 |
| 5,994,757 A | * | 11/1999 | Ichikawa | 257/530 |
| 6,208,567 B1 | * | 3/2001 | Yamauchi et al. | 365/200 |
| 6,259,146 B1 | * | 7/2001 | Giust et al. | 257/529 |
| 6,291,836 B1 | * | 9/2001 | Kramer et al. | 257/50 |

* cited by examiner

Primary Examiner—Viet Q. Nguyen

(57) ABSTRACT

A level of a solid state memory device includes main memory and address logic. The address logic is programmed by causing current to flow through an address element of the logic; and irradiating the address element so that the address element changes resistance states.

26 Claims, 9 Drawing Sheets

OPTICALLY PROGRAMMABLE ADDRESS LOGIC FOR SOLID STATE DIODE-BASED MEMORY

BACKGROUND

The present invention relates to information storage devices. More specifically, the present invention relates to one-time programmable (OTP) solid state memory.

Portable devices such as PDAs, handheld computers, digital cameras and digital music players include memory for storing data, digital images and MP3 files. Different types of memory are available for these portable devices. Conventional memory types include flash memory, mini-hard drives, mini-compact discs, and magnetic tape. However, each of these memory types has one or more of the following limitations: large physical size, low storage capacity, relatively high cost, poor robustness, slow access time and high power consumption.

A solid state diode-based OTP memory is disclosed in assignee's U.S. Ser. No. 09/875,356 filed Jun. 5, 2001. Compared to the conventional memory, the diode-based memory has a high shock tolerance, low power consumption, fast access time, moderate transfer rate and good storage capacity. The diode-based memory can fit into a standard portable interface (e.g., PCMCIA, CF) of a portable device.

Address logic of the diode-based memory device is formed on the same level as main memory. In a multi-level diode-based memory device, each level has main memory and address logic (unlike conventional solid state memory such as DRAM). Moreover, the address logic of the diode-based memory device is programmable. The address logic may be programmed after each layer has been fabricated. Since no masking is required, physical processing is simplified.

SUMMARY

According to one aspect of the present invention, a level of a solid state memory device is programmed by causing current to flow through an element of the level; and irradiating the element so that the element changes resistance states.

Other aspects and advantages of the present invention will become apparent from the following detailed description, taken in conjunction with the accompanying drawings, illustrating by way of example the principles of the present invention.

DETAILED DESCRIPTION

Figure 1:
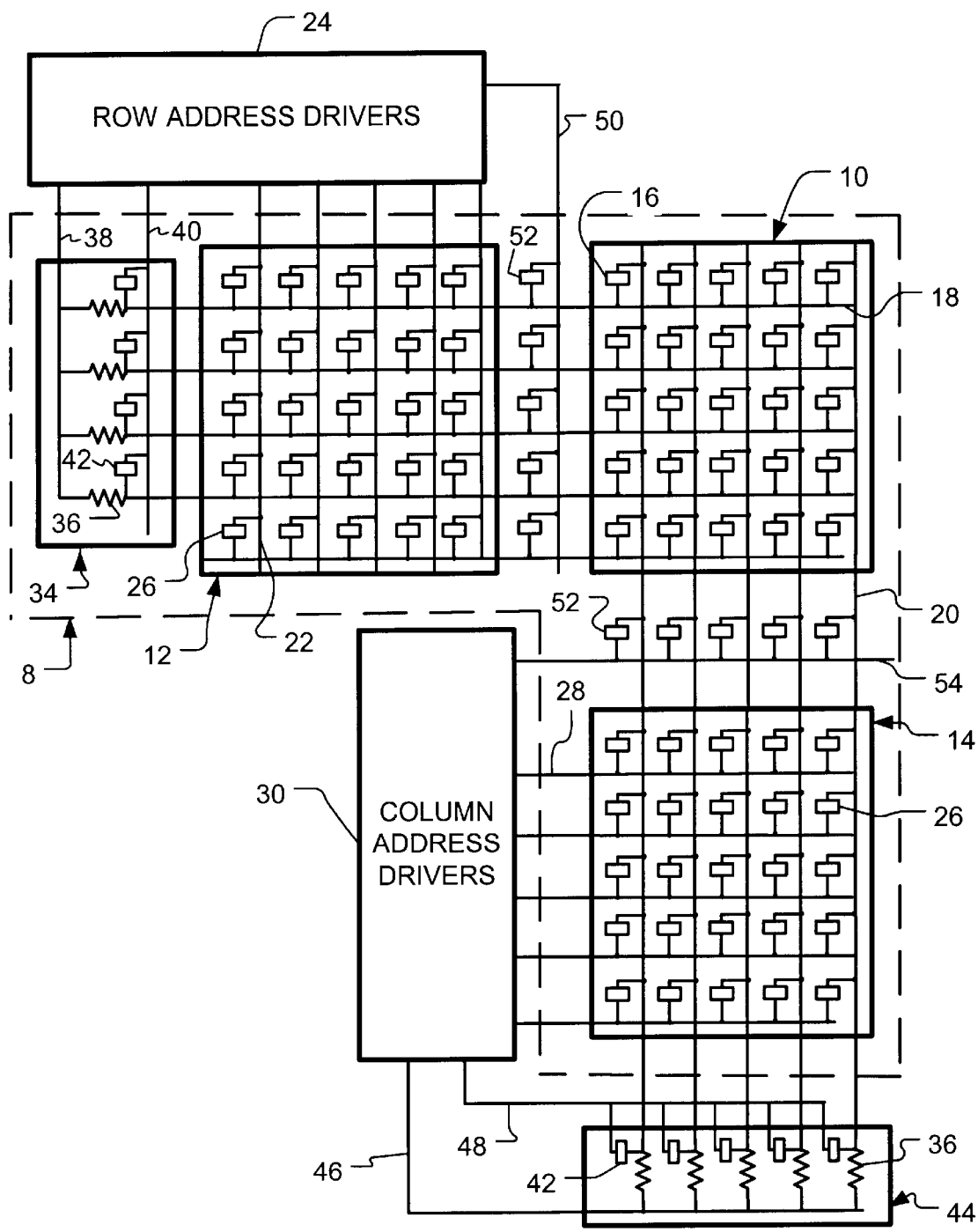
FIG. 1 is a block diagram of a level of a solid state memory device.

Reference is made to FIG. 1, which shows a level 8 of a solid state memory device. The level 8 includes main memory 10 and programmable address logic 12, 14. The main memory 10 includes a cross point resistive array of OTP memory elements 16, traces functioning as word lines 18 extending along rows of the memory elements 16, and traces functioning as bit lines 20 extending along columns of the memory elements 16. There may be one word line 18 for each row of the memory elements 16 and one bit line 20 for each column of memory elements 16. Each memory element 16 is located at a cross point of a word line 18 and a bit line 20. Only a relatively small number of memory elements 16 is shown to simplify the illustration of the level 8. In practice, arrays of any size may be used.

The address logic 12, 14 uses combinational diode logic for addressing the memory elements 16 during read and write operations. The address logic 12, 14 includes an OTP row decoder 12 for selecting the word lines 18. The row decoder 12 selects the word lines 18 by decoding addresses supplied on row address lines 22 (the addresses may be supplied by external row address drivers 24). The row decoder 12 includes a plurality of OTP address elements 26. Each address element 26 of the row decoder 12 is at a cross point of a word line 18 and a row address line 22.

The address logic 12, 14 also includes an OTP column decoder 14 for selecting the bit lines 20. The column decoder 14 selects the bit lines 20 by decoding addresses supplied on column address lines 28 (the addresses may be supplied by external column address drivers 30). The column decoder 14 also includes a plurality of OTP address elements 26. Each address element 26 of the column decoder 14 is at the cross point of a bit line 20 and a column address line 28.

One end of each word line 18 terminates at row sense logic 34. The row sense logic 34 includes multiple sense resistors 36, each sense resistor 36 connected between a row power line 38 and an end of a word line 18. A row sense line 40 crosses the word lines 18. The row sense logic 34 also includes multiple sense elements 42, each sense element 42 connected between the row sense line 40 and a word line 18.

One end of each bit line 20 terminates at column sense logic 44. The column sense logic 44 includes multiple sense resistors 36, each sense resistor 36 connected between a column power line 46 and an end of a bit line 20. A column sense line 48 crosses the bit lines 20. The column sense logic 44 also includes multiple sense elements 42, each sense element 42 connected between the column sense line 48 and a bit line 20.

A row programming line 50, between the main memory 10 and the row decoder 12, crosses the word lines 18. Programming elements 52 are connected between the row programming line 50 and the word lines 18.

A column programming line 54, between the main memory 10 and the column decoder 14, crosses the bit lines 20. Programming elements 52 are connected between the column programming line 54 and the bit lines 20.

The memory elements 16, the address elements 26, the sense elements 42 and the programming elements 52 may all be diode-based. This simplifies the fabrication of the level 8.

Figure 2A:
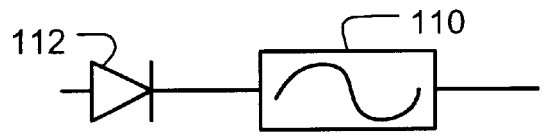
FIGS. 2a–2c are illustrations of different types of programmable elements in the level.
Figure 2B:
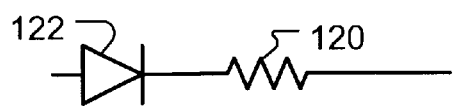
Figure 2C:

Different types of programmable elements 16/26/42/52 are shown in FIGS. 2a–2c. The programmable element of FIG. 2a includes a fuse 110 coupled in series with a diode 112. Prior to programming, the resistance state of such an element is low, with the fuse 110 intact. During programming, the resistance state of the element can be changed from low to high by "blowing" the fuse 110.

The programmable element of FIG. 2b includes a resistor 120 coupled in series with a diode 122. Prior to programming, the resistance state of such an element is low, with the resistor 120 intact. During programming, the resistance state of the element can be changed from low to high by "blowing" the resistor 120.

The programmable element of FIG. 2c includes only a diode 132. Prior to programming, the diode 132 is intact, whereby its resistance state is low. During programming, the diode 132 can be opened to change its resistance state from low to high. Such a diode 132 functions as a fuse. In the alternative, the diode 132 can function as an anti-fuse, going from a high resistance state to a low resistance state during programming.

The programmable elements 16/26/42/52 are not limited to the types shown in FIGS. 2a–2c. For example, the programmable elements 16/26/42/52 could include transistors instead of diodes.

Figure 3:
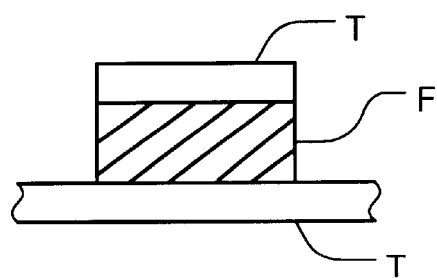
FIG. 3 is another illustration of a programmable element.

Returning now to FIG. 1, the level 8 may be fabricated as follows. Column lines 20 are formed on a substrate, a multi-layer film of silicon is formed on the column lines 20, and word lines 18 are formed on the film. Each programmable element 16/26/42/52 may be formed as that portion of the film (F) between two crossing traces (T) (see FIG. 3). The size of the programmable element 16/26/42/52 is determined by the overlapping area between crossing traces and the thickness of the film. For example, a diode in main memory 10 is formed as that portion of the film between crossing word and bit lines 18 and 20.

The different layers of the film have appropriate dopings (and/or a combination of crystalline and amorphous silicon) to form the diodes 112, 122, 132. Additional layers with appropriate dopings can be added to form resistors 120, fuses 110, or anti-fuses. The sense resistors 36 may be formed by modifying the ends of the word and bit lines 18 and 20. The row and column address drivers 24 and 30 may be formed on the substrate.

The row and column decoders 12 and 14 may be programmed during device fabrication, after the level 8 has been fabricated. The decoders 12 and 14 are programmed by changing the resistance states of selected address elements from a low resistance state to a high resistance state (or vice versa). Details of the combinational logic for addressing the main memory (that is, the details about which address elements are selected) are disclosed in assignee's U.S. Ser. No. 09/875,356. Various ways of programming the decoders 12 and 14 will be described below.

Data may be written to the main memory 10 by supplying row and column addresses to the row and column decoders 12 and 14. A write current flows through a selected word line 18 and a selected bit line 20 and, therefore, flows through the memory element 16 at the cross point of the selected word and bit lines 18 and 20. Magnitude of the write current is sufficient to change the resistance state of the selected element (e.g., by opening the fuse 110 of FIG. 2a, opening the resistor 120 of FIG. 2b, opening the diode 132 of FIG. 2c, shorting the anti-fuse).

The resistance state of a memory element 16 may be sensed by supplying row and column addresses to the row and column decoders 12 and 14. A voltage is applied to the second row sense line 40 and a voltage of opposite polarity is applied to the second column sense line 48. A sense current flows through a selected word line 18 and a selected bit line 20 and, therefore, flows through the memory element 16 at the cross point of the selected word and bit lines 18 and 20. Magnitude of the sense current indicates the resistance state of the selected memory element 16.

Each address element 26 has a link that may be broken during programming. For example, the fuse 110 is the link for the address element shown in FIG. 2a, the resistor 120 for the address element of FIG. 2b, and the diode 132 for the address element of FIG. 2c. Each link is made of a photo-sensitive material typically used for solar cells and displays. For example, the links may be made of amorphous silicon with a P-doped layer. The conductivity of intrinsic amorphous silicon is typically $10^6$ times lower than the doped amorphous silicon. However, when irradiated with light, the conductivity of the intrinsic region increases to a level similar to that of the doped region. By irradiating an address element 26, density of current flowing through the address element 26 is increased to the point that the link blows.

Figure 4:
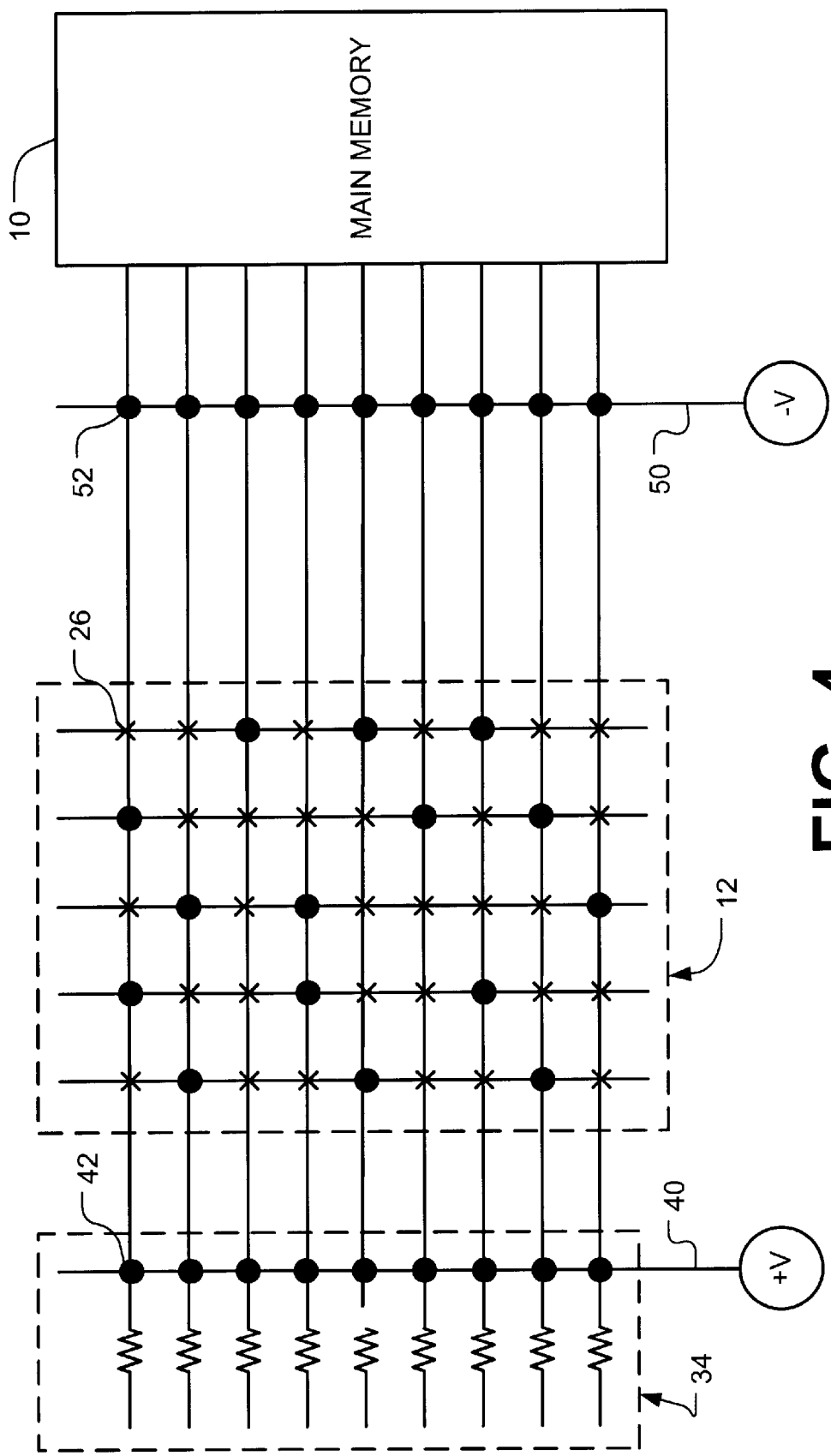
FIG. 4 is an illustration of a method of changing the resistance states of address elements.

Reference is now made to FIG. 4, which illustrates a method of changing the resistance state of "selected" address elements 26. Address elements that are selected are indicated by X's. These selected elements will have their resistance states changed during programming. Unselected address elements are indicated by O's. These unselected address elements will not have their resistance states changed during programming.

During programming of the row decoder 12, a voltage (−V) is applied across the row programming line 50, and a voltage of opposite polarity (+V) is applied to the row sense line 40. (During programming of the column decoder 14, a voltage is applied across the column programming line 54, and a voltage of opposite polarity is applied to the column sense line 48.) This will effectively apply a voltage across two diodes connected back-to-back. The voltage is applied in such a manner that the diodes in the programming elements 52 are forward biased and the diodes in the address elements 26 are reverse biased. The voltages can be applied by the row and column address drivers 24 and 30.

Electromagnetic radiation (EM) is applied to the selected address elements 26. The electromagnetic radiation is of sufficient intensity to significantly increase the conductivity of the selected address elements. Consequently, the density of the current flowing through the selected address elements is increased. This increase in current density causes the links of the selected address elements to open. The links of the unselected address elements remain unbroken.

The programming elements 52 may have a higher current-carrying capability than the selected address elements 26.

This optical programming of the address diodes 26 may be performed by using a jig including addressable laser diodes. The laser diodes irradiate only the selected address elements 26. Lenses and other optical elements may be used to focus the EM radiation on the selected address elements 26. All selected elements 26 may be irradiated simultaneously, whereby the resistance states of all selected address elements 26 are changed at the same time.

In the alternative, the unselected address elements could be masked from the irradiation, and blanket irradiation could be applied to the layer. Resistance states of the masked address elements would not be changed.

For EM radiation to be applied to selected address elements 26, the traces may be made transparent to the EM radiation. Materials for these transparent traces may be of the type used in liquid crystal displays. As an alternative to making transparent traces, the EM radiation may be guided to the selected address elements 26.

An alternative approach to changing the resistance states of the selected address elements 26 will now be described. The unselected address elements in each decoder 12 and 14 are formed with a greater current-carrying capability than the selected address elements 26. During programming of the decoders 12 and 14, all address elements are reversed-biased and the sense elements are forward-biased in the manner described above. Consequently, a current flows through the selected and unselected address elements. This current causes the links of the selected address elements 26 to break, but the current does not cause the links of the unselected selected address elements to break.

The links may be broken without applying EM radiation to the selected address elements 26. Therefore, the links may be made of a material that is not photoconductive. However, reliability in breaking the links may be increased by making the links from a photoconductive material and irradiating the selected address elements 26 during programming.

The memory elements 16 and the selected address elements 26 may be made at the minimum resolution, thus allowing the optimal storage capacity. The unselected address elements may be made with larger dimensions by increasing the size of the address lines above the minimum resolution and increasing those portions of the memory lines (i.e., word and bit lines) that cross the address lines.

Figure 5A:
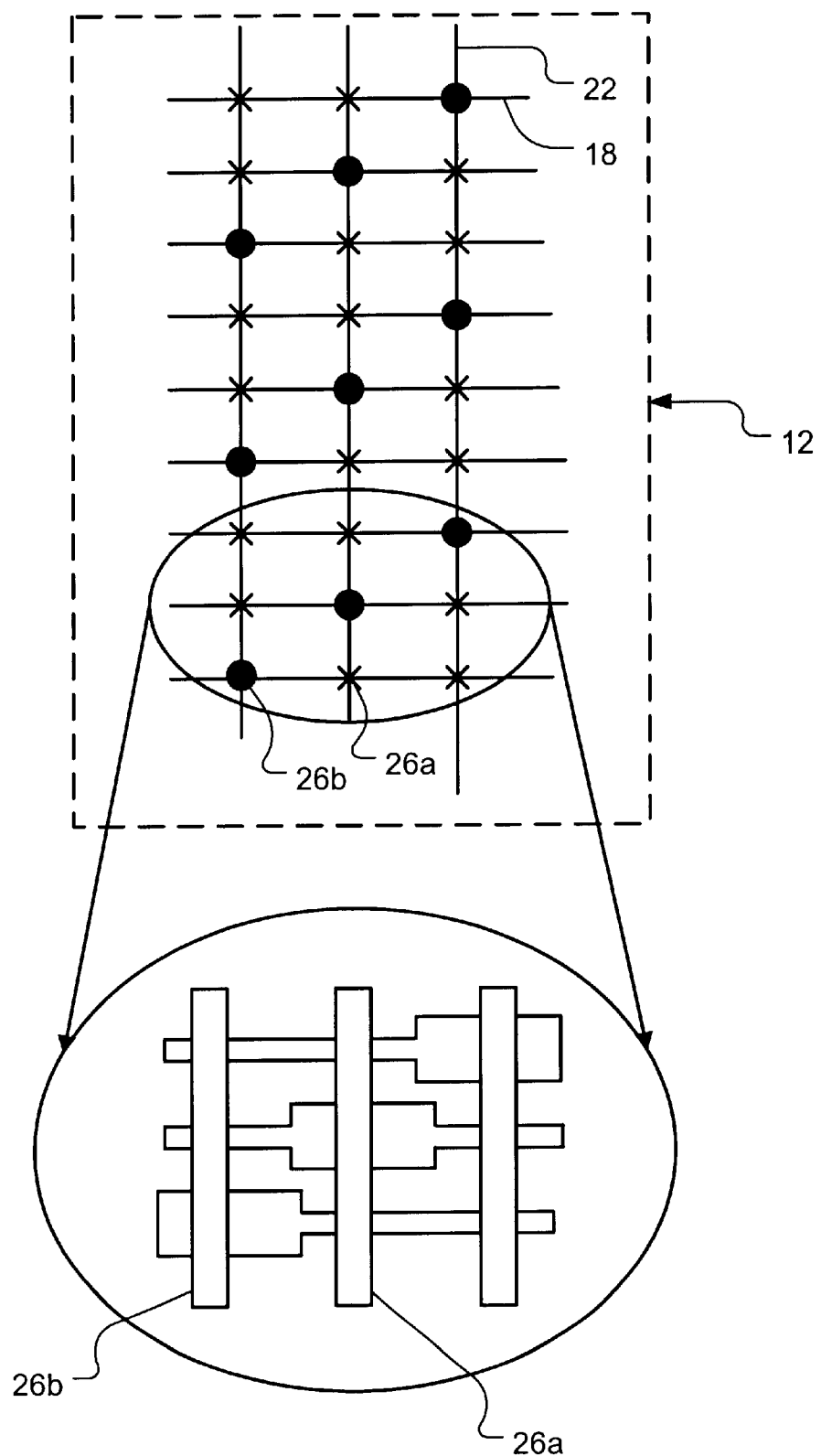
FIGS. 5a–5c are illustrations of different layouts for selected and unselected address elements of a decoder.
Figure 5B:
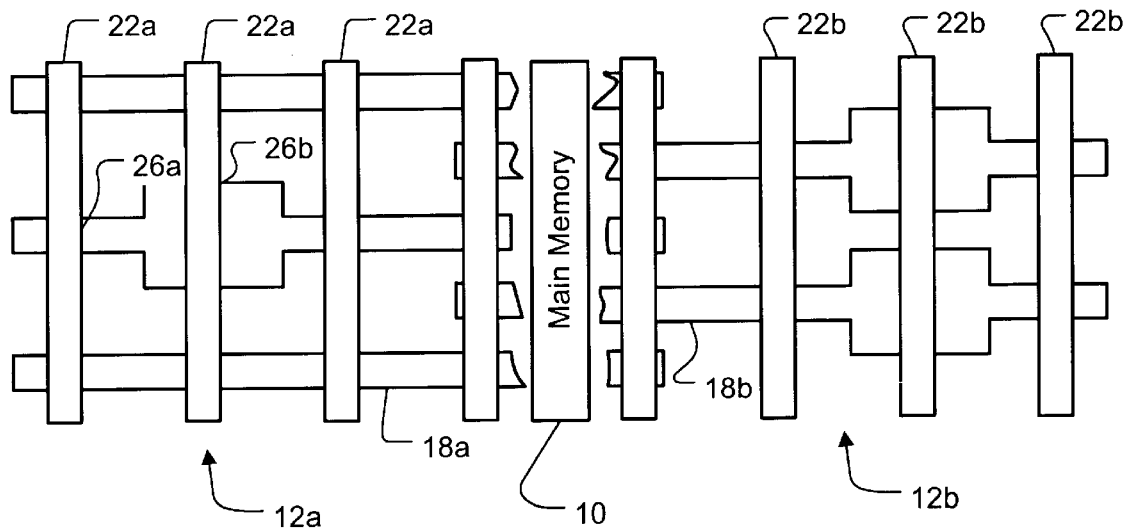
Figure 5C:
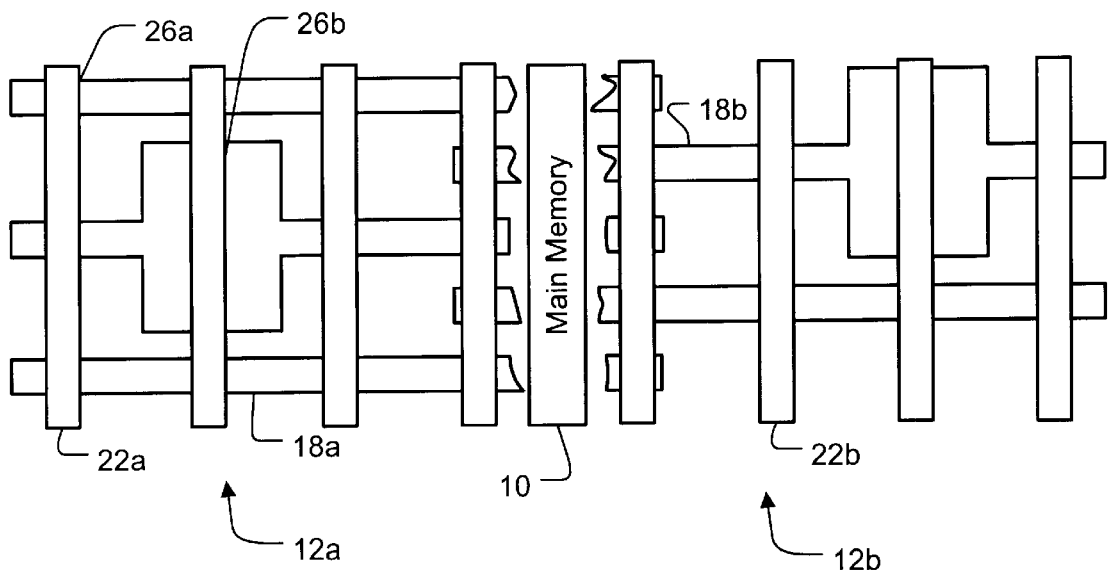

FIGS. 5a–5c show different layouts for selected address elements 26a and enlarged, unselected address elements 26b. If an address protocol can guarantee that no column has adjacent enlarged (unselected) address elements 26b, then the address logic may have the configuration shown in FIG. 5a. FIG. 5a shows a row decoder 12 in which columns do not contain any adjacent enlarged (unselected) address elements 26b. Although not shown as such, the address elements 26a and 26b may be formed at full contact pitch.

If the address protocol cannot provide such a guarantee, whereby the address logic could include adjacent enlarged address elements in a column, the distance between word lines 18 may be increased. However, this would reduce the data storage density of the main memory.

Instead, the row decoder 12 may be divided into two spaced-apart sets 12a and 12b, as shown in FIG. 5b. Odd-numbered word lines 18a are interdigitated with even-numbered word lines 18b. A first set of address lines 22a crosses the odd-numbered word lines 18a, and a second set of address lines 22b crosses the even-numbered word lines 18b. The first and second sets of address lines 22a and 22b receive the same address signal.

This approach allows the size of adjacent memory elements 26b to be increased threefold, yet it still allows the selected memory elements 26a to be fabricated at minimum resolution. If an address protocol can guarantee that no column has adjacent enlarged (unselected) address elements 26b, the size of the non-adjacent enlarged memory elements 26b can be increased fivefold (see FIG. 5c).

FIGS. 5a–5c were just described in connection with the row decoder 12. However, the same principles can be applied to the column decoder 14.

Figure 6A:
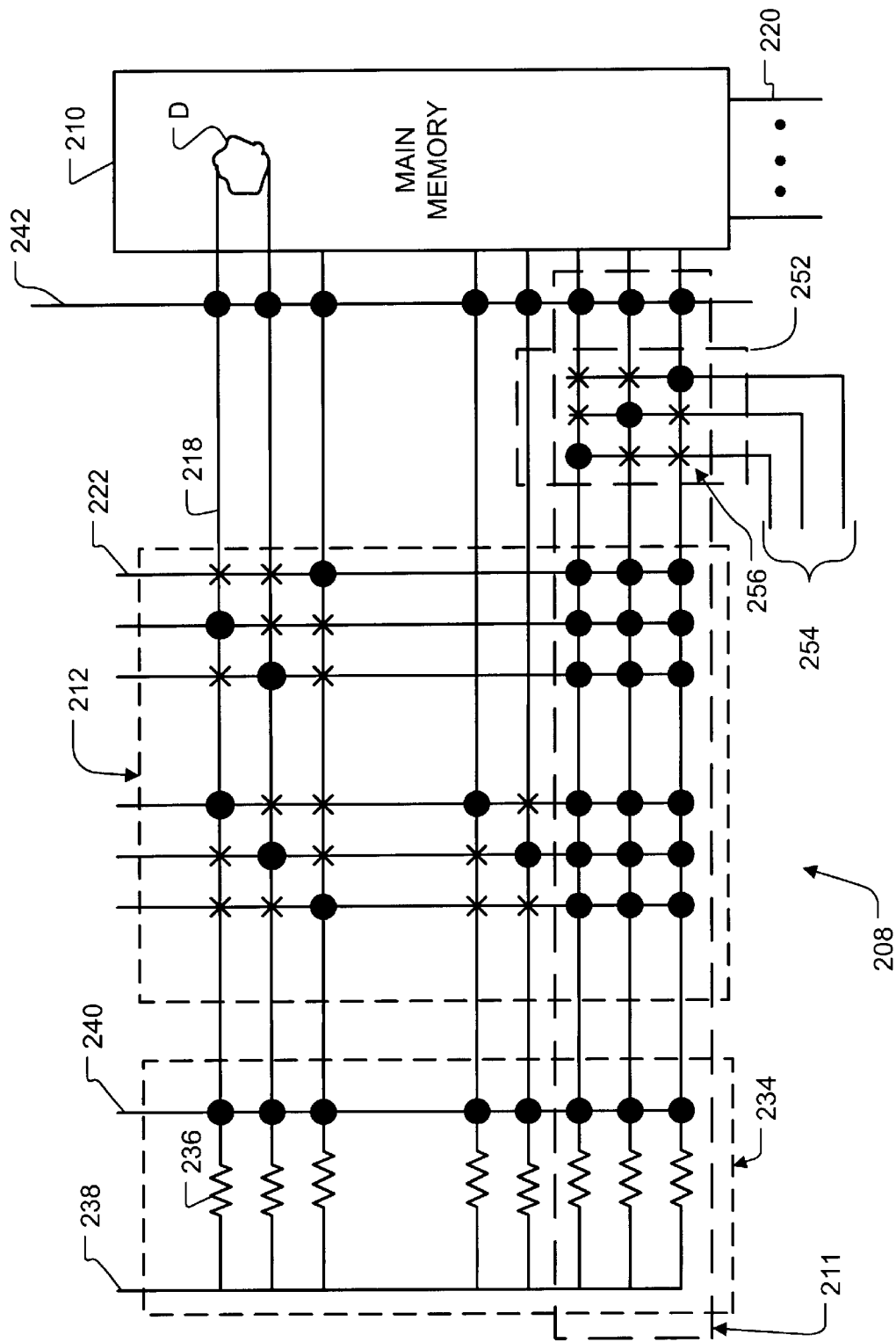
FIGS. 6a and 6b are illustrations of a level of a solid state memory device that allows for defect management.

Reference is now made to FIG. 6a, which shows portions of a level 208 of a memory device that allows for defect management. The level 208 includes main memory 210, a row decoder 212, and row sense logic 234. The row sense logic 234 includes sense resistors 236. The level 208 further includes word lines 218, bit lines 220, row address lines 222, a power supply line 238, a row sense line 240, and a row programming line 242. Elements for addressing, sensing and programming on the column side are not shown. Selected address elements are indicated by X's and unselected address elements are indicated by O's.

A defective area in the level 8 is identified by the letter D. For instance, the defective area D might be caused by a short of two adjacent word lines 218. The defective area D renders the two associated rows unusable.

The row decoder 212 can be programmed to avoid the defective area D. The word lines 218 corresponding to the defective area D are disconnected from main memory 210. For example, breaks (discontinuities) may be formed in these word lines 218. In the alternative, the sense resistors 236 of these word lines 218 may be opened. If the sense resistors 236 are made from a photoconductive material such as amorphous silicon, they can be opened or "blown" by causing a current to flow through the resistors (e.g., by biasing the address and write lines with respect to the drive voltage) and then applying EM radiation. Applying the EM radiation increases the conductivity. The increase in current causes the irradiated sense resistor to be blown.

The disconnected word lines are replaced by spare word lines. Certain word lines and their connected memory, address and sense elements are reserved as spares. FIG. 6a shows that the last few word lines of the level 208 are reserved as spares (as indicated by the block 211). However, the location of the spares are not so limited; the spare word lines may be at any location in the level 208. Initially, all address elements connected to the spares are unselected.

The spare word lines have additional logic 252. Each address line 254 is connected to a corresponding spare word line by a spare address element 256. The encoding may be performed by optically programming the selected spare address elements 256.

Figure 6B:
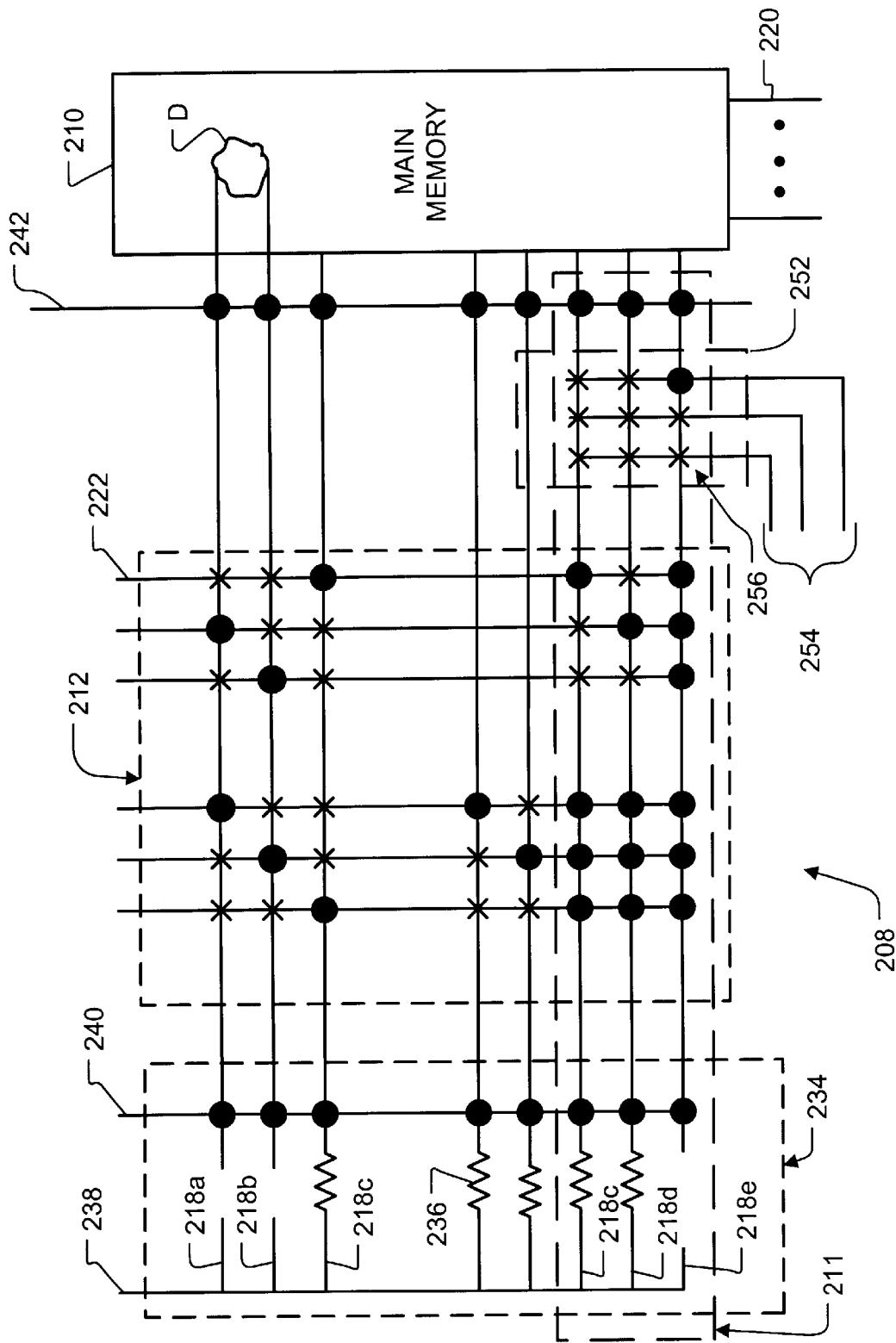

FIG. 6b shows the decoder 212 re-mapped to avoid the defective area D. The two word lines 218a and 218b associated with the defective area D are disconnected by opening their sense resistors 236.

Two spare lines 218c and 218d replace the two lines 218a and 218b that were disconnected. The address elements 256 connected to these two replacement spare lines 218c and 218d have been programmed to match the resistance states of selected and unselected address elements for the two disconnected lines 218a and 218b. Thus, these two replacement spare lines 218c and 218d now have the same addresses as the disconnected word lines 218a and 218b. The spare address elements connected to these two replacement spare lines 218c and 218d are changed to a high resistance state and, thus, effectively removed from the row decoder 212.

The unused spare line 218e is disconnected by opening its sense resistor 236.

Figure 7:
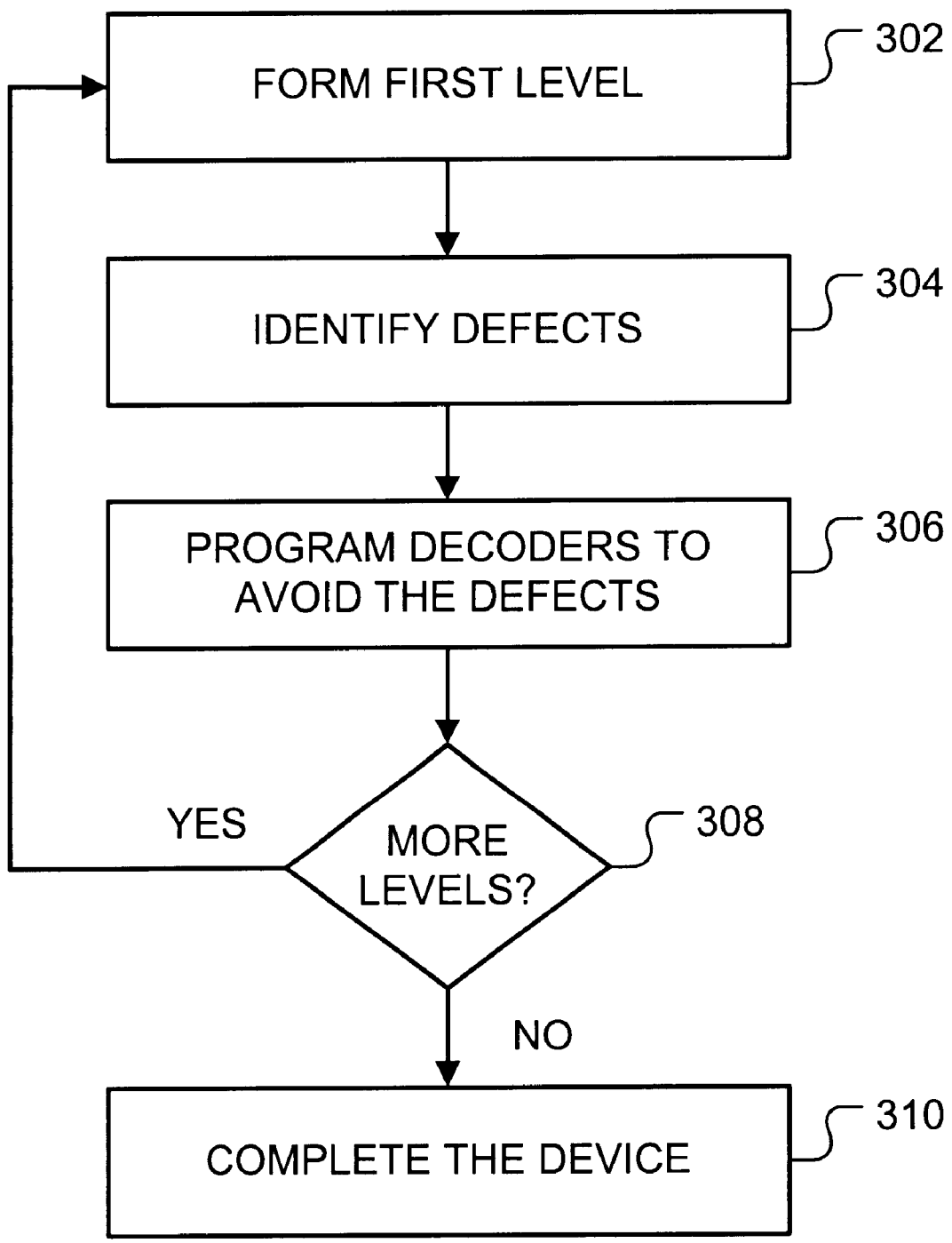
FIG. 7 is an illustration of a method of avoiding defects in a multi-level solid state memory device.

Reference is now made to FIG. 7, which illustrates a method of fabricating a multi-level solid state memory device. After a first level of the device is formed (block 302), defects in the first level are identified (block 304). Such defects include, but are not limited to, discontinuities or defects in one or both cross point wires, and shorts between data lines. The defects may be identified by measuring I–V characteristics of each cross point in main memory.

After the defects have been identified, the decoders are programmed to avoid a significant number of the defects (block 306). The programming reduces the defect level to zero or an acceptable level for error correction (that is, a level that does not stress or overload error correction).

Subsequent levels are formed (block 308). Each time a level is formed (block 302), defects in the level are identified (block 304), and the decoders on that level are programmed to avoid the defects (block 306).

After the levels have been formed, the memory device is completed (block 310). As part of completing the memory device, address lines are connected, interface circuitry is added and the levels are packaged.

Details of the design and fabrication of the main memory, addressing of multiple levels, packaging of multiple layers into a single chip, reading and writing to main memory, etc. are disclosed in assignee's U.S. Ser. No. 09/875,356.

This method allows defect management to be implemented on individual levels and therefore avoids the problem of a defective area in one level eliminating the use of the same memory area of another level. It also implements defect management in a manner that physically re-positions the defective address location and therefore does not require a defect list for re-mapping. This simplifies use of the memory system.

Figure 8:
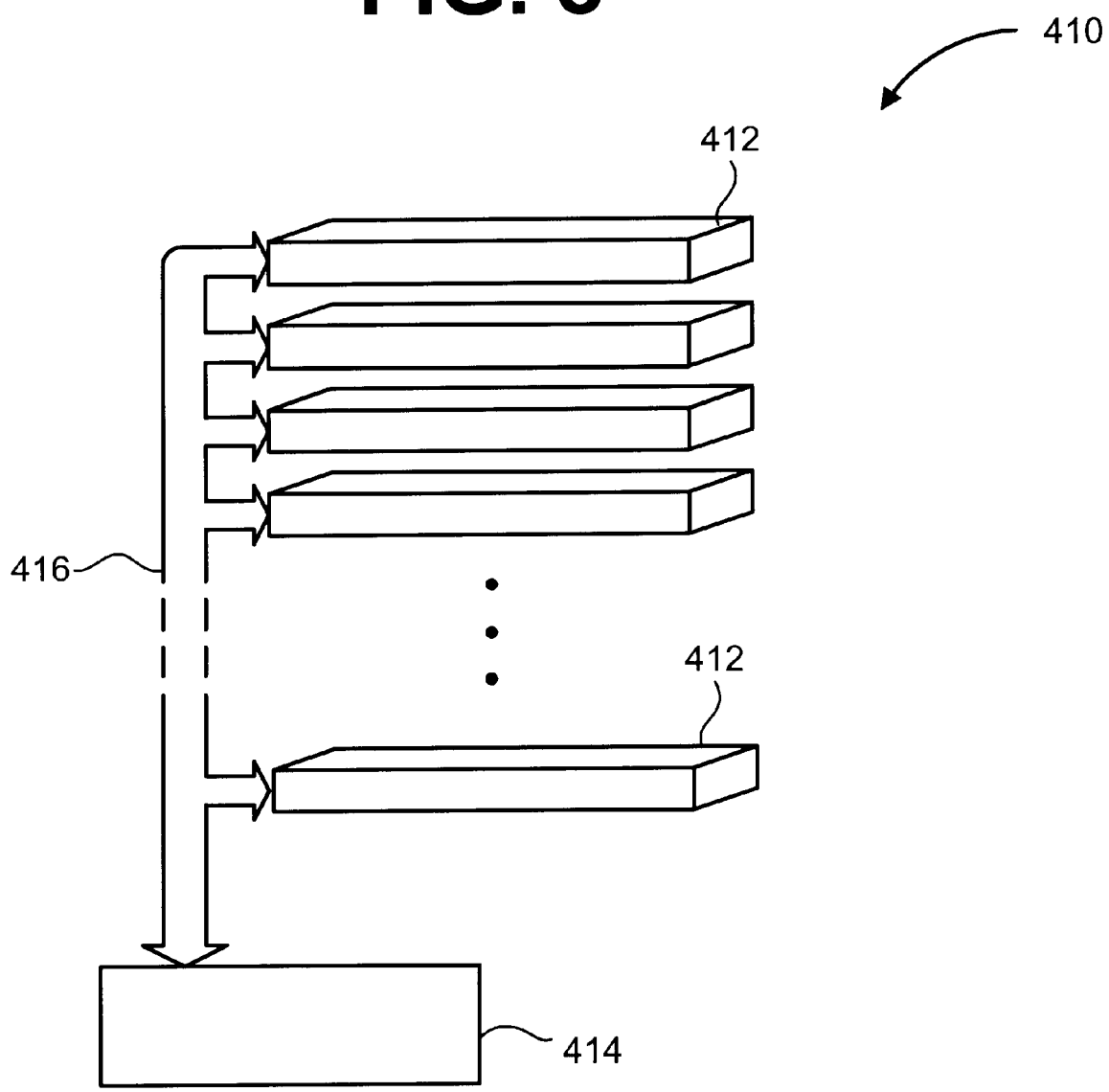
FIG. 8 is an illustration of a multi-level solid state memory device.

Reference is now made to FIG. 8, which shows a multi-level solid state memory device 410. Multiple levels 412 are stacked on top of one another. Unlike conventional semiconductor memory, decoders are formed in each layer 412. Each layer 410 is connected to control/interface circuitry 414 by a memory system interface 416. The control/interface circuitry 414 is formed in the substrate. The control/interface circuitry 414 performs error code correction (ECC) and defect management functions, as well as functions for operating the device 410. These functions include setting write voltages, setting write enable lines and controlling power sense striping, addressing the memory by converting logical addresses to address line patterns required to access physical memory locations, and data read processing of sense line outputs.

The device 410 is not limited to control/interface circuitry that is shared by the layers. Instead each level 412 may have its own control/interface circuitry.

The main memory could be programmed at the factory, in the same manner and at the same time as the address logic. The main memory might be pre-programmed with microcode, map data, etc.

The present invention is not limited to the specific embodiments described and illustrated above. Instead, the present invention is construed according to the claims that follow.

What is claimed is:

1. A method of programming a level of solid state memory device, the method comprising:
   causing current to flow through a selected element of the level; and
   irradiating the selected element so that the current causes the selected element to change resistance states.

2. The method of claim 1, wherein the selected element includes a diode that is irradiated.

3. The method of claim 1, wherein the selected element includes a fuse that is irradiated.

4. The method of claim 1, wherein the selected element includes a resistive element that is irradiated.

5. The method of claim 1, wherein a trace covering the selected element is transparent to irradiation, and wherein the selected element is irradiated through the trace.

6. The method of claim 1, wherein the element includes an address diode; and wherein the method further comprises reverse-biasing the address diode.

7. The method of claim 6, wherein the device includes a level having address logic and programming logic; and wherein the method further comprises forward-biasing a programming element that is connected in series with the selected address element.

8. The method of claim 7, wherein the programming element has a higher current-carrying capability than the selected address element.

9. The method of claim 1, further comprising masking unselected elements in the level; wherein blanket irradiation is applied to the level.

10. The method of claim 1, wherein the level further includes an unselected address element, and wherein a light source is used to irradiate the selected elements but not the unselected element.

11. A method of programming a decoder on a level of a solid state memory device, the level also including programming logic, address elements of the decoder being connected in series with programming elements of the programming logic, the method comprising:
    reverse-biasing selected address elements and forward-biasing the programming elements connected in series with the selected address elements; and
    irradiating the selected address elements.

12. The method of claim 11, wherein the device also includes a programming line connected to the programming elements and sense logic including a sense line; and wherein the sense and programming lines are used to reverse-bias the selected address elements and forward-bias the programming elements connected in series with the selected address elements.

13. A solid state memory device comprising diode-based programmable elements and traces connected to the programmable elements, at least one of the programmable elements and the traces having breakable links made of photoconductive material.

14. The device of claim 13, wherein the programmable elements are address elements of a decoder, and wherein the address elements are made of the photoconductive material.

15. The device of claim 13, wherein the programmable elements are memory elements of main memory, and wherein the memory elements are made of the photoconductive material.

16. The device of claim 13, wherein the device has multiple levels, each level having address logic and main memory, at least one of the address logic and the main memory including programmable elements made of photoconductive material.

17. The device of claim 16, the address logic including a decoder, each level further including programming logic and sense logic on opposite sides of the decoder, the programming logic including a programming line, the sense logic including a sense line.

18. The device of claim 13, wherein resistors in the traces are made of a photoconductive material.

19. The device of claim 13, wherein the traces are transparent to electromagnetic radiation of a particular wavelength.

20. The device of claim 13, wherein the programmable elements include diodes.

21. The device of claim 13, wherein the programmable elements include fuses.

22. The device of claim 13, wherein the programmable elements include anti-fuses.

23. The device of claim 13, further comprising a mask covering at least one of the programmable elements.

24. A decoder of a solid state memory device, the decoder comprising a plurality of programmable diode-based address elements including breakable links made of photoconductive material.

25. The decoder of claim 24, wherein the address elements include fuses.

26. The decoder of claim 24, wherein the address elements include anti-fuses.

* * * * *